(12) United States Patent  (10) Patent No.: US 7,642,826 B2
Takai  (45) Date of Patent: Jan. 5, 2010

(54) DLL CIRCUIT AND SEMICONDUCTOR DEVICE HAVING THE SAME

(75) Inventor: Yasuhiro Takai, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 11/682,662

(22) Filed: Mar. 6, 2007

(65) Prior Publication Data

US 2007/0210843 A1 Sep. 13, 2007

(30) Foreign Application Priority Data

Mar. 9, 2006 (JP) .............................. 2006-064935

(51) Int. Cl.
*H03L 7/06* (2006.01)
(52) U.S. Cl. ....................... 327/158; 327/149; 327/153; 327/161
(58) Field of Classification Search ................. 327/141, 327/149, 152, 153, 155, 158, 161–163
See application file for complete search history.

(56) References Cited

U.S. PATENT DOCUMENTS

| 6,674,314 | B2 * | 1/2004 | Takai | 327/158 |
| 6,680,635 | B2 * | 1/2004 | Lee | 327/158 |
| 6,750,688 | B2 | 6/2004 | Takai | 327/158 |
| 6,812,759 | B2 | 11/2004 | Suzuki | 327/158 |
| 6,949,966 | B2 | 9/2005 | Suzuki | 327/158 |
| 7,057,431 | B2 | 6/2006 | Kwak | 327/158 |
| 7,057,433 | B2 * | 6/2006 | Cho et al. | 327/161 |
| 7,142,026 | B2 * | 11/2006 | Kwak | 327/158 |
| 7,176,734 | B2 * | 2/2007 | Park | 327/161 |
| 7,184,509 | B2 * | 2/2007 | Cho et al. | 375/373 |
| 7,279,946 | B2 * | 10/2007 | Minzoni | 327/158 |
| 7,327,176 | B2 * | 2/2008 | Takai et al. | 327/158 |
| 7,348,823 | B2 * | 3/2008 | Takai et al. | 327/291 |
| 7,420,399 | B2 * | 9/2008 | Han | 327/175 |
| 2003/0117191 | A1 * | 6/2003 | Kwak | 327/158 |
| 2005/0110540 | A1 * | 5/2005 | Kwak | 327/158 |
| 2005/0189979 | A1 * | 9/2005 | Park | 327/291 |
| 2007/0176657 | A1 * | 8/2007 | Byun et al. | 327/158 |
| 2008/0284475 | A1 * | 11/2008 | Lee | 327/149 |

FOREIGN PATENT DOCUMENTS

| JP | 2001-056723 | 2/2001 |
| JP | 2002-111493 | 4/2002 |

(Continued)

*Primary Examiner*—Lincoln Donovan
*Assistant Examiner*—Patrick O'Neill
(74) *Attorney, Agent, or Firm*—Hayes Soloway P.C.

(57) ABSTRACT

A DLL circuit comprising: delay circuits which output first and second delayed clock signals obtained by delaying the reference clock signal by a delay times selected according to control signals; an interpolation circuit which interpolates a phase difference between the delayed clock signals to output an internal clock signal; an output circuit which generates a predetermined signal; a dummy output circuit which has the same transmission characteristics as the output circuit and outputs a feedback clock signal having the same phase as the predetermined signal; a phase comparison circuit which compares phases of the reference clock signal and the feedback clock signal; delay control circuits which controls the control signals in a direction where both phases are equal; wherein the delay time of the second delayed clock signal is larger than the first delayed clock signal by an amount equivalent to one cycle of the reference clock signal.

20 Claims, 11 Drawing Sheets

| | FOREIGN PATENT DOCUMENTS | | JP | 2004-064735 | 2/2004 |
|----|----|----|----|----|----|
| JP | 2003-91331 | 3/2003 | JP | 2004-146900 | 5/2004 |
| JP | 2003-101409 | 4/2003 | | | |
| JP | 2003-324348 | 11/2003 | * cited by examiner | | |

DLL CIRCUIT AND SEMICONDUCTOR DEVICE HAVING THE SAME

BACKGROUND OF THE INVENTION

1. Field of the Invention

This invention relates to a DLL (Delay Locked Loop) circuit, and particularly relates to a DLL circuit which generates an internal signal having a predetermined time difference relative to an external clock signal and a semiconductor device (for example, a synchronous type semiconductor device) having this DLL circuit.

2. Related Art

Recently, DDR-SDRAM (Double Data Rate—Synchronous Dynamic Random Access Memory) is widely known as a high speed synchronous type semiconductor memory device. When read operation is performed in the DDR-SDRAM, each edge timing of a DQ signal being input/output data and a DQS signal for determining a timing to capture input/output data needs to be controlled to have an accurate phase relationship with an external reference clock. Therefore, a DLL circuit for generating the DQS and DQ signals by phase control based on the reference clock signal (for example, see JP-2003-91331).

A general DLL circuit used in the conventional synchronous type semiconductor memory device has, for example, a configuration shown in FIG. 10. In the DLL circuit shown in FIG. 10, the external reference clock signal CLK is input to a delay circuit 102 through an input circuit 101 and delayed by a delay time according to a control signal C supplied from a delay control circuit 104. A signal D from the delay circuit 102 is input to a DQ output circuit 107 and a DQS output circuit 108 as an internal clock signal CLK0 through a buffer D. The DQ signal is generated by the DQ output circuit 107 and the DQS signal is generated by the output circuit 108, so as to be output to the outside. Meanwhile, the internal clock signal CLK0 is also input to a dummy output circuit 106 having the same transmission characteristics as the DQ output circuit 107 and the DQS output circuit 108, and a feedback clock signal RCLK having the same phase as the DQ and DQS signals is output. In a phase comparison circuit 103, phases of the reference clock signal CLK and the feedback clock signal RCLK are compared, and the delay control circuit 104 is controlled in a direction where both phases are equal. Such a configuration allows to obtain the DQ and DQS signals which maintain stable synchronization with the reference clock signal CLK.

However, the reference clock signal CLK input to the DLL circuit from the outside does not always have a normal waveform, and jitter is assumed to occur at a certain timing. FIG. 11 shows operation waveforms of the DLL circuit of FIG. 10 in a state in which jitter occurs in the reference clock signal CLK. As shown in FIG. 11, arising timing of the reference clock signal CLK delays at fourth cycle by time A, so that cycle-to-cycle jitter occurs in which the period deviates between a predetermined cycle and a subsequent cycle. Under the influence thereof, the delay of the same time n is transmitted on rising timings of the signal D1, the internal clock signal CLK0, the DQS and DQ signals. Therefore, it is a problem that size of an effective window used for capturing input/output data is reduced by an amount of the time Δ, and correspondingly, the possibility of data latching failure increases.

BRIEF SUMMARY OF THE INVENTION

It is an object of the present invention to provide a DLL circuit which in the case of occurrence of jitter when generating a predetermined signal in synchronization with a reference clock signal, data latching failure due to deviation of the edge timing can be prevented.

An aspect of the present invention is a DLL circuit comprising: a delay circuit to which a reference clock signal from outside is input and which outputs a first delayed clock signal obtained by delaying said reference clock signal by a delay time selected according to a first control signal and outputs a second delayed clock signal obtained by delaying said reference clock signal by a delay time selected according to a second control signal; an interpolation circuit which interpolates a phase difference between said first delayed clock signal and said second delayed clock signal so as to output an internal clock signal; an output circuit which generates a predetermined signal using said internal clock signal as a timing reference and outputs the same to outside; a dummy output circuit which has the same transmission characteristics as said output circuit, to which said internal clock signal is input, and which outputs a feedback clock signal having the same phase as said predetermined signal; a phase comparison circuit which compares a phase of said reference clock signal and a phase of said feedback clock signal; a first delay control circuit which controls said first control signal in a direction where both the phases are equal to each other in said phase comparison circuit; and a second delay control circuit which controls said second control signal in a direction where both the phases are equal to each other in said phase comparison circuit, wherein said second delayed clock signal is controlled such that the delay time thereof is larger than that of said first delayed clock signal by an amount equivalent to one cycle of said reference clock signal.

According to the DLL circuit of the present invention, when generating the predetermined signal in synchronization with the reference clock signal, two delayed clock signals having delay times different by one cycle from each other are obtained by delaying the reference clock signal by the delay circuit, the phase difference therebetween is interpolated, and the feedback clock signal is obtained through the dummy output circuit having the same transmission characteristics as the output circuit. Then, phases of the reference clock signal and the feedback clock signal are compared, the first and second control signals are controlled to increase or decrease in accordance with the comparison result so as to be supplied to the delay circuit. By employing such a configuration, even when jitter occurs in the reference clock signal at a certain timing and edge timings thereof become different, the jitter affects the two delayed clock signals at different timings. Therefore, by interpolating the two delayed clock signals, the time difference corresponding to jitter reduces to half, data latching failure can be effectively prevented.

In the DLL circuit of the present invention, said delay circuit may comprise: a plurality of delay elements connected in multiple stages; a first selector for selectively switches connections to a plurality of taps of said plurality of delay elements in response to said first control signal; and a second selector for selectively switches connections to a plurality of taps of said plurality of delay elements in response to said second control signal.

In the DLL circuit of the present invention, said delay circuit may comprise: a first delay circuit to which said reference clock signal is input and which outputs said first delayed clock signal obtained by delaying said reference clock signal by a delay time selected according to said first control signal; and a second delay circuit to which said first delayed clock signal is input and which outputs said second delayed clock signal obtained by delaying said first delayed clock signal by a delay time selected according to said second control signal.

In the DLL circuit of the present invention, said first delay circuit may include a plurality of delay elements connected in multiple stages, and a selector for selectively switches connections to a plurality of taps of said plurality of delay elements in response to said first control signal, and said second delay circuit may include a plurality of delay elements connected in multiple stages, and a selector for selectively switches connections to a plurality of taps of said plurality of delay elements in response to said second control signal In the DLL circuit of the present invention, said interpolation circuit may control flow of current pulled from an output node according to said first delayed clock signal and said second delayed clock signal, and may operate to average an edge timing of said first delayed clock signal and an edge timing of said second delayed clock signal.

In the DLL circuit of the present invention, said interpolation circuit may comprise: a first interpolation unit for interpolating a time difference between rising edges of said first delayed clock signal and said second delayed signal; a second interpolation unit for interpolating a time difference between falling edges of said first delayed clock signal and said second delayed signal; and a multiplexer for mixing and outputting output signals of said first interpolation unit and said second interpolation unit.

The semiconductor device of the present invention may comprise said DLL circuit.

In the semiconductor device of the present invention, predetermined signals generated by said output circuit may be a signal which includes input/output data of a memory array and a signal which determines a timing to capture the input/output data.

In the semiconductor device of the present invention, in an auto refresh of said memory array, the delay time of said first delayed clock signal and the delay time of said second delayed clock signal may be adjusted respectively.

The semiconductor device of the present invention may further comprise, lock-in control means for controlling a lock-in operation when turning on power, from a state in which the delay time of said first delayed clock signal and the delay time of said second delayed clock signal are equal to each other, and after increasing the delay time of said second delayed clock signal by an amount equivalent to one cycle of said reference clock signal by force, shifting to normal phase control.

As descried above, according to the invention, when performing phase control using a reference clock signal, two delayed signals having delay times different by one cycle are interpolated. And when the reference clock signal including jitter at a certain cycle is input, the jitter appears at different cycles for the two delayed clock signals. Thus, timing difference due to jitter appearing on the interpolated signal can be reduced to half compared to the original reference clock signal. Accordingly, in a predetermined signal to be output, a reduced amount of an effective window corresponding to occurrence of jitter is also reduced to half, so that possibility of data latching failure is reduced and reliability can be improved.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

A preferred embodiment of the invention will be described below with reference to accompanying drawings. In this embodiment, a semiconductor device to which the present invention is applied is, for example, a DDR-SDRAM as a synchronous type semiconductor device having a DLL circuit for generating DQS and DQ signals. The configuration and operation of this embodiment will be described below using FIGS. 1 to 7.

Figure 1:
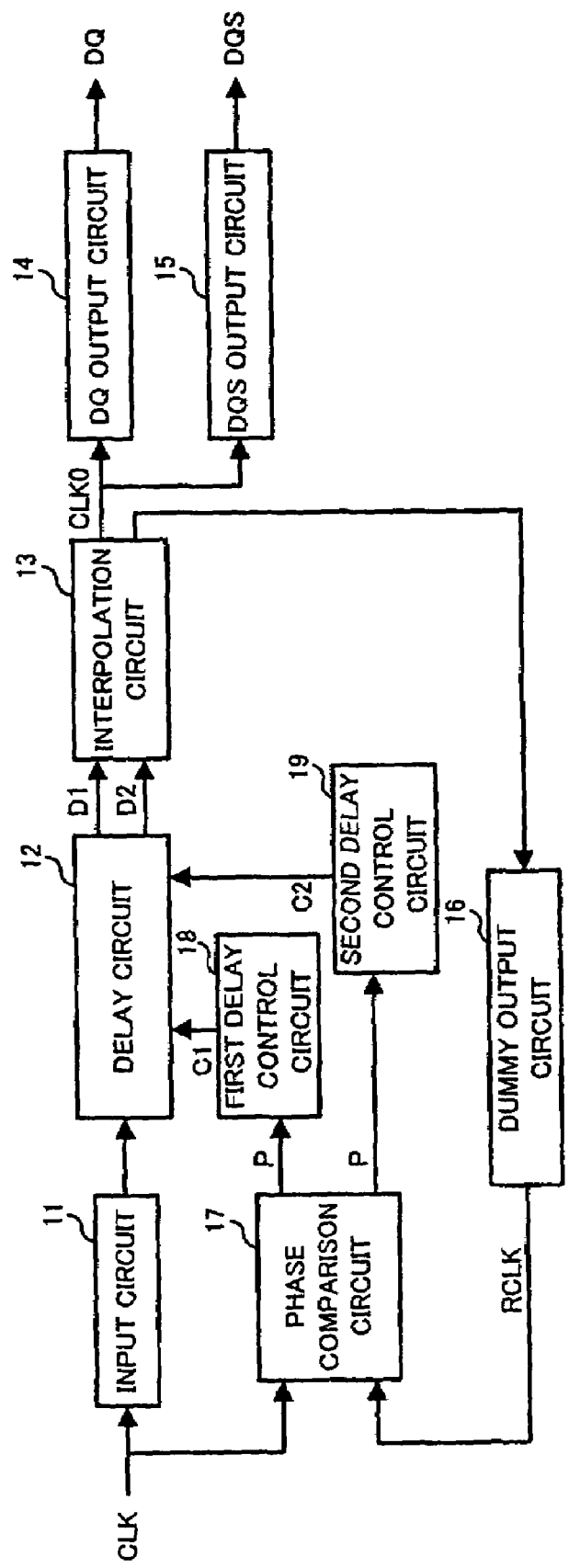
FIG. 1 is a block diagram showing a configuration of a DLL circuit of an embodiment of the invention.

FIG. 1 is a block diagram showing a configuration of a DLL circuit of this embodiment. The DLL circuit shown in FIG. 1 includes an input circuit 11, a delay circuit 12, an interpolation circuit 13, a DQ output circuit 14, a DQS output circuit 15, a dummy output circuit 16, a phase comparison circuit 17, a first delay control circuit 18 and a second delay control circuit 19, and has a function of generating DQ and DQS signals required for data input/output in the DDR-SDRAM.

In the above configuration, a reference clock signal CLK from the outside is buffered by the input circuit 11 and thereafter is input to the delay circuit 12. The delay circuit 12 outputs delayed clock signals D1 and D2 (hereinafter referred to as simply "signals D1 and D2") respectively obtained by delaying the reference clock signal CLK by two different delay times. The delay circuit 12 has multiple-stage delay elements which transmit the input reference clock signal CLK, and one signal D1 is controlled to be delayed by a first delay time according to a control signal C1 supplied from the first delay control circuit 18 while the other signal D2 is controlled to be delayed by a second delay time according to a control signal C2 supplied from the second delay control circuit 19.

Figure 2:
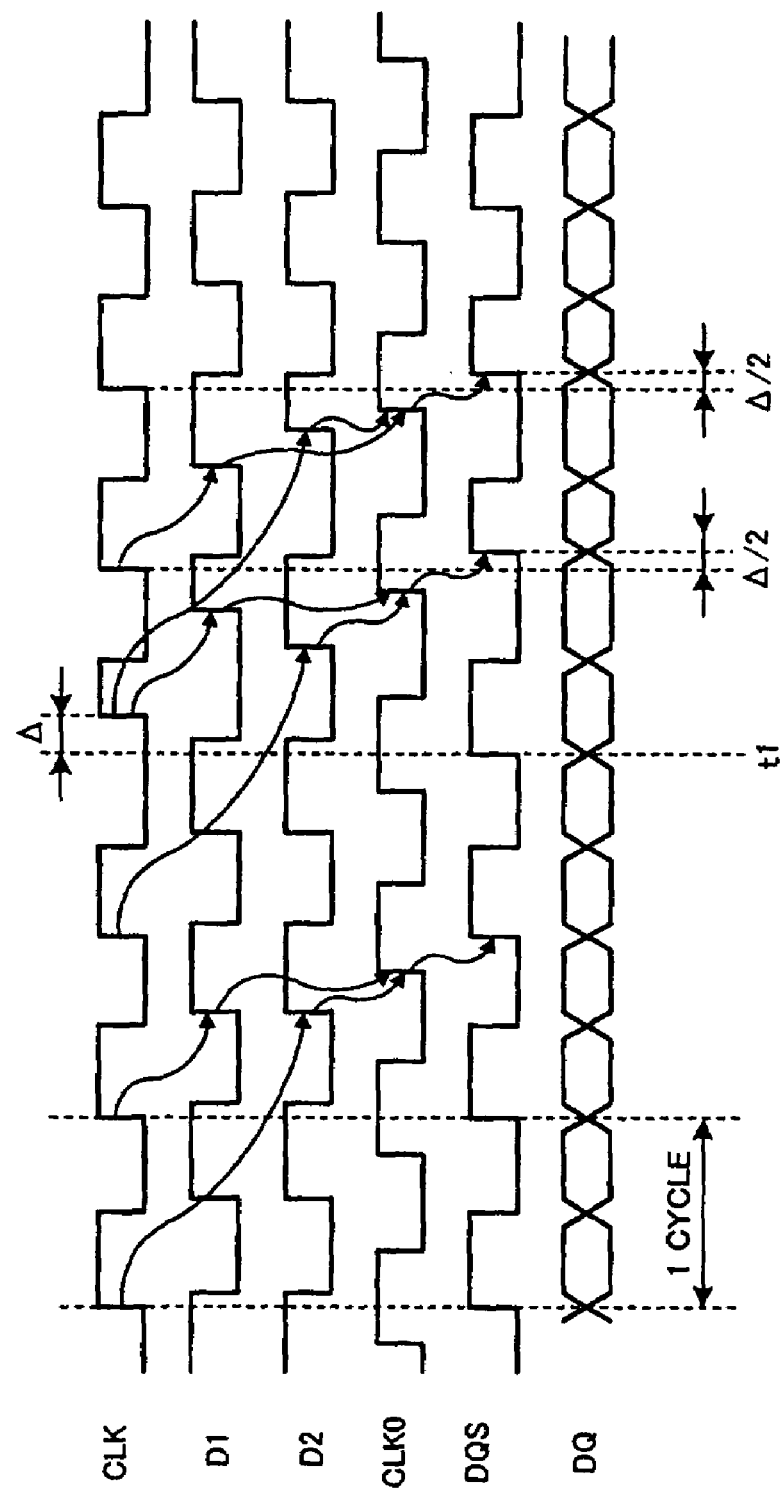
FIG. 2 is a diagram showing operation waveforms of the DLL circuit of FIG. 1.

Here, operation waveforms of the DLL circuit of FIG. 1 are shown in FIG. 2. As shown in FIG. 2, using the reference clock signal CLK having a constant period tCK as a reference, the signal D1 is delayed within one cycle and the signal D2 is further delayed one cycle longer than the signal D1. Thus, if the reference clock signal CLK maintains accurate phase, the signals D1 and D2 are equal in phase to each other.

In FIG. 1, the two signals D1 and D2 output from the delay circuit 12 are both input to the interpolation circuit 13. The interpolation circuit 13 interpolates the two signals D1 and D2, and outputs the interpolated signal as an internal clock signal CLK0. Thereby, the internal clock signal CLK0 has an edge timing obtained by averaging the edge timings of the signals D1 and D2. The internal clock signal CLK0 is input to the DQ output circuit 14 and the DQS output circuit 15 respectively, and a DQS signal and a DQ signal which use the internal clock signal CLK0 as a timing reference are generated and supplied to the outside of the DLL circuit. In FIG. 2, edges of the DQS signal and the DQ signal change at the same timing. However, it is premised that a source synchronous system is employed in this embodiment, the DQ signal is latched in a state in which a memory controller shifts the phase of the DQS signal by tCK/4.

Further, the internal clock signal CLK0 is also input to the dummy output circuit 16. The dummy output circuit 16 is a circuit having the same transmission characteristics as those of the DQ output circuit 14 and the DQS output circuit 15, and outputs a feedback clock signal RCLK having the same phase as the DQ and DQS signals. Accordingly, the phases of the outputs of the DQ and DQS signals changes depending on the feedback clock signal RCLK as a comparison target.

The reference clock signal CLK from the outside and the feedback clock signal RCLK from the dummy output circuit 16 are input to the phase comparison circuit 17, and the phases thereof are compared to output a phase comparison signal P indicating the comparison results. The phase comparison signal P is a signal for determining whether the phase of the feedback clock signal RCLK is in a state of preceding or in a state of delaying relative to the phase of the reference clock signal CLK. The phase comparison signal P is input to the first delay control circuit 18 and the second delay control circuit 19, in which control is performed in accordance with the comparison result. That is, when determining that the phase of the feedback clock signal RCLK precedes, the signals C1 and C2 change so as to increase the delay time. While when determining that the phase of the feedback clock signal RCLK delays, the signals C1 and C2 change so as to decrease the delay time.

The first delay control circuit 18 and the second delay control circuit 19 are circuits for controlling to increase or decrease the control signals C1 and C2 in response to the phase comparison signal P. Specifically, a counter capable of counting up or down control in response to the phase comparison signal P can be used as each of the first and second delay control circuits 18, 19. In this case, the control signals C1 and C2 correspond to the count values of the counter. And a D flip-flop for latching the reference clock signal CLK at a rising edge of the feedback clock signal RCLK can be used as the phase comparison circuit 17. Thereby, when the latch signal is low, the feedback clock signal RCLK precedes, so that the delay time is to be increased. And when the latch signal is high, the feedback clock signal RCLK delays, so that the delay time is to be decreased.

By performing the above-mentioned control at a predetermined interval in the DLL circuit, the phases of the reference clock signal CLK and the feedback clock signal RCLK are controlled to become equal to each other. As a result, a state is maintained in which the phases of the DQ signal and the DQS signal each as a final control target are equal to that of the reference clock signal CLK. Since a configuration in which the two signals D1 and D2 having different timings by one cycle from each other are interpolated in this embodiment, particularly data latching failure can be effectively prevented when jitter appears in the reference clock signal CLK. That is, as shown in FIG. 2, if jitter (cycle-to-cycle jitter) appears at a cycle of timing T1 of the reference clock signal CLK and the rising timing thereof delays by time $\Delta$, the jitter affects the signal D1 one cycle later, while affects the signal D2 two cycles later. In the internal clock signal CLK0 obtained by interpolating the two signals D1 and D2, rising timings of both jitters appearing one cycle later and two cycles later delay by time $\Delta t/2$. Accordingly, the DQ and DQS signals behave the same way, and the influence of the jitter is reduced to half, so that the possibility of latching failure can be reduced.

Figure 3:
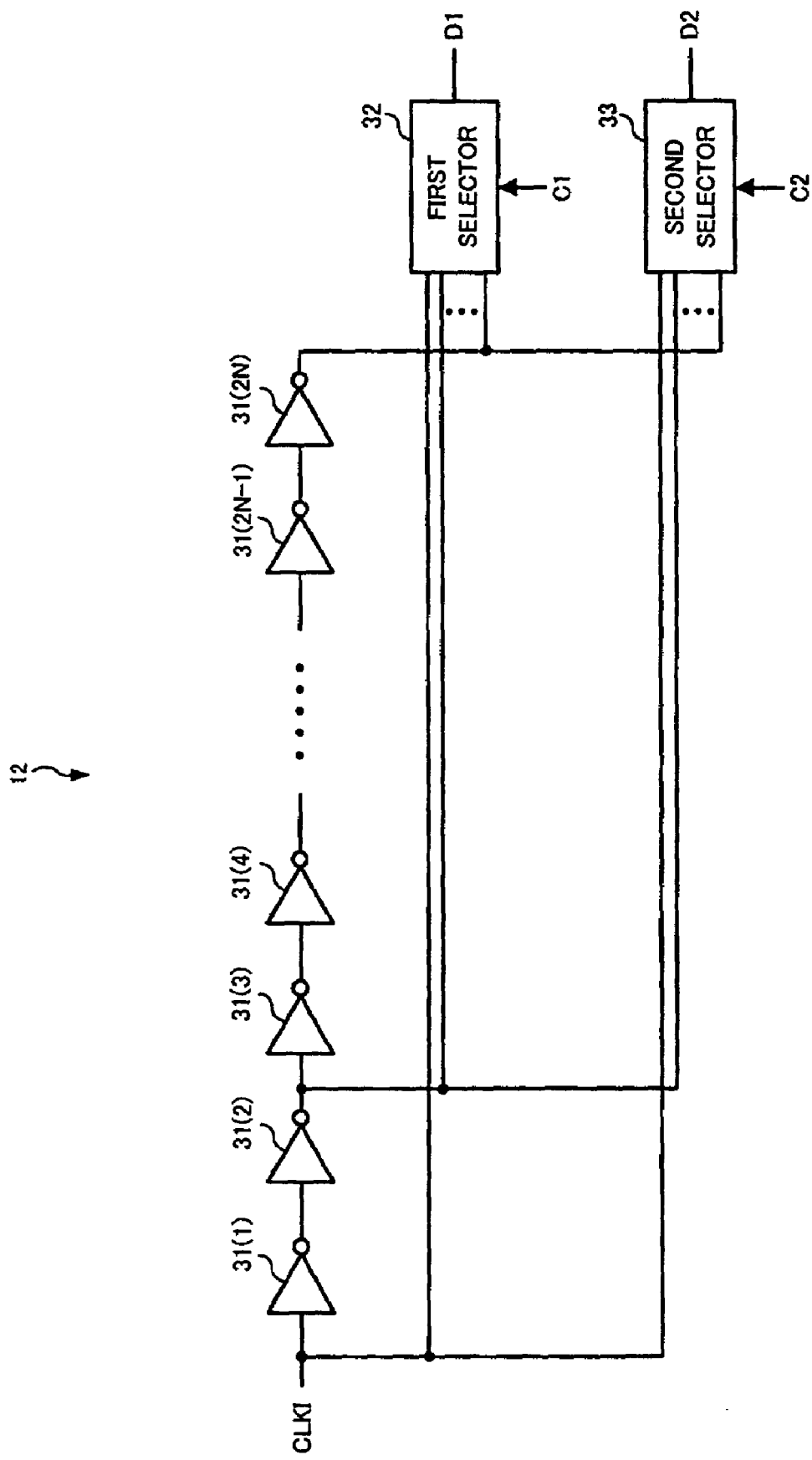
FIG. 3 is a block diagram showing a configuration of a delay circuit.

Next, a configuration of the delay circuit 12 of FIG. 1 will be described using FIG. 3. The delay circuit 12 as shown in FIG. 3 includes 2N inverters 31 (1 to 2N) connected in multiple stages, a first selector 32 and a second selector 33. Each pair of the inverters 31(1 to 2N) form a delay element, and the delay time of an input clock signal CLK1 can be increased or decreased according to N+1 positions of taps of the N-stage delay elements. Thus, N+1 taps are connected to the first selector 32 and the second selector 33, and a desired tap can be switched in response to the control signals C1 and C2. Since the input clock signal CLK1 from the first inverter 31(1) is delayed by a common delay time t0 through the delay element of each stage, the signals D1 and D2 each having a delay time at intervals of t0 within a range from 0 to Nt0 can be selectively output from the first and second selectors 32 and 33.

For example, when both control signals C1 and C2 are n-bit count values, the maximum number of taps which can be selected is $2^n$, and thus a configuration for connecting $2^n-1$ stage delay elements may be employed in FIG. 3. It is desirable to appropriately determine the number N of stages of the delay elements in accordance with a unit delay time of each delay element and a desired delay time corresponding to a predetermined number of cycles.

In addition, although the delay time capable of being adjusted by fluctuating the control signals C1 and C2 has intervals between adjacent taps, a fine adjustment circuit may be also provided for fine adjustment. For example, a fine adjustment circuit may be configured, which extracts two signals corresponding to adjacent taps of the first selector 32 and interpolates the two signals with a desired internal division ratio. The same fine adjustment circuit can be provided for the second selector 33. In this manner, by combining the fine adjustment circuit with the delay circuit 12, the delay time can be adjusted in a wide range using the N-stage delay elements, and at the same time the delay time can be finely adjusted by the fine adjustment circuit.

Figure 4:
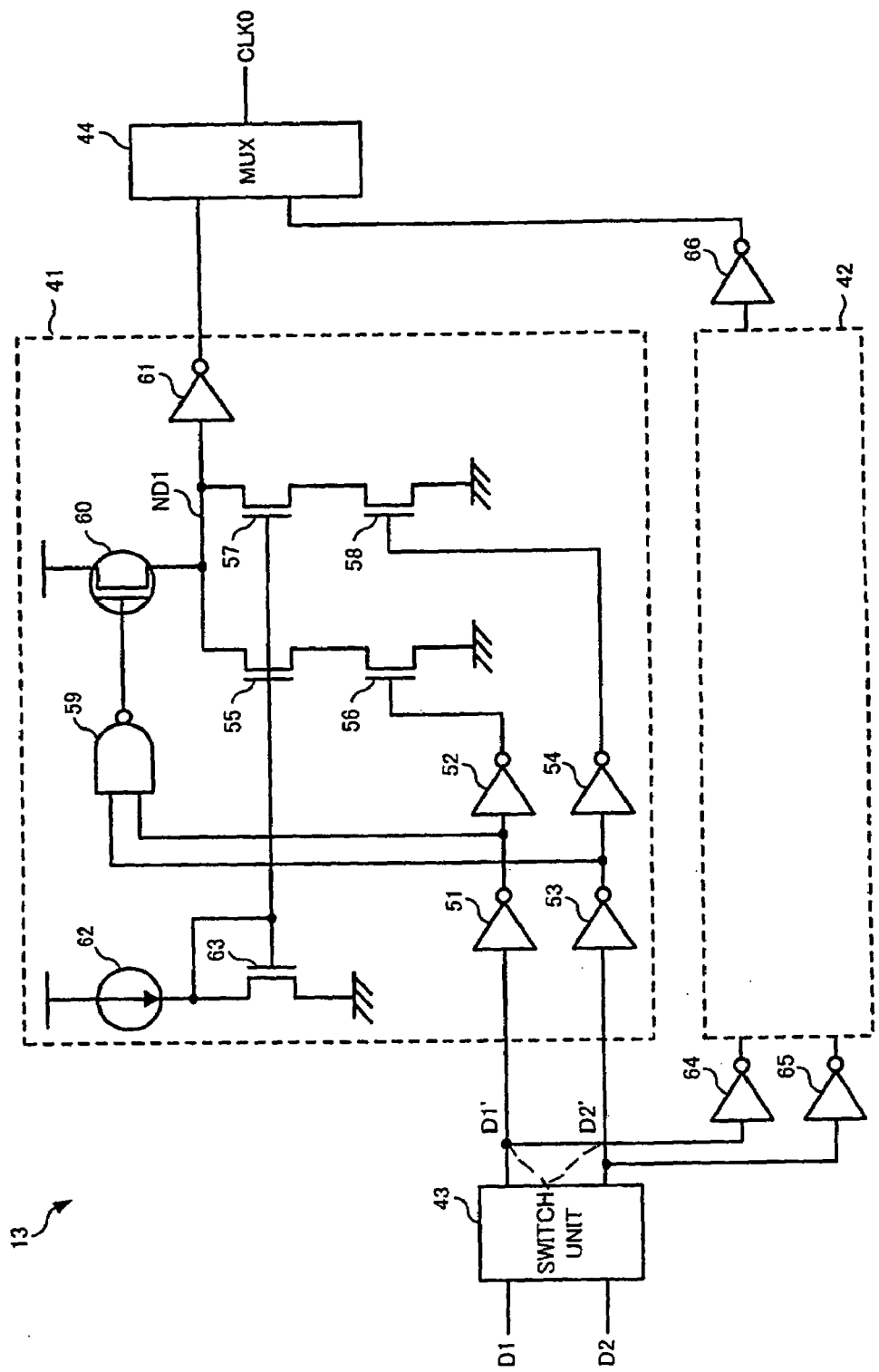
FIG. 4 is a diagram showing a configuration of an interpolation circuit.

Next, a configuration of the interpolation circuit 13 will be described using FIG. 4. The interpolation circuit 13 as shown in FIG. 4 has a configuration in which a first interpolation unit 41 and a second interpolation unit 42 are arranged in parallel, and an input-side switch unit 43 and an output-side multiplexer 44 are provided. In FIG. 4, the switch unit 43 switches the signals D1 and D2 output from the delay circuit 12 in response to the operating state of the DLL circuit and outputs the signals D1' and D2'. Control is performed such that the input signal D1 is connected to the output signal D1' and the input signal D2 is connected to the output signal D2' in a normal phase control, while being switched to a different state in a lock-in operation. The detail of the lock-in operation and the configuration of the switch unit 43 will be described later.

The signals D1' and D2' are input to the first interpolation unit 41 through the switch unit 43, and the signals D1' and D2' are inverted and input to the second interpolation unit 42 through inverters 64 and 65. Thereby, the first interpolation unit 41 operates to interpolate rising edges of the signals D1' and D2', and the second interpolation unit 42 operates to interpolate falling edges of the signals D1' and D2'. The inverted signal in the second interpolation unit 42 is returned to the original phase by an output-side inverter (not shown). In FIG. 4, only the circuit configuration of the first interpolation unit 41 is shown. However, since the second interpolation unit 42 has the same configuration as the first interpolation unit 41, the following description of the first interpolation unit 41 is applicable to the second interpolation unit 42.

In the first interpolation unit 41 of FIG. 4, a first series circuit including NMOS transistors 55 and 56 and a second series circuit including NMOS transistors 57 and 58 are connected in parallel between node ND1 and ground, and the node ND1 is connected to the multiplexer 44 through an inverter 61. The signal D1' is applied to the gate of the NMOS transistor 56 through the inverters 51 and 52, and the signal D2' is applied to the gate of the NMOS transistor 58 through the inverters 53 and 54. Each gate of the NMOS transistors 55 and 57 is biased by a constant current circuit including a current source 62 and an NMOS transistor 63. An output of a NAND circuit 59 is applied to a gate of a PMOS transistor 60 connected between power supply and the node ND1.

Figure 5A:
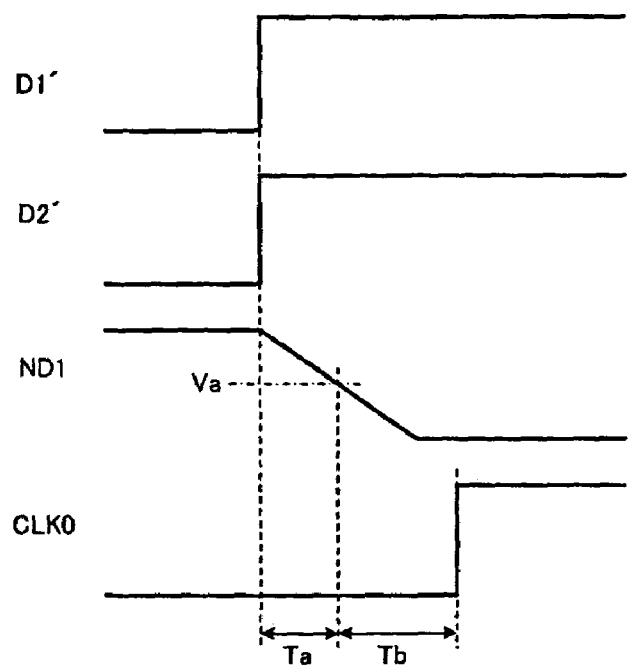
FIGS. 5A and 5B are waveform diagrams explaining a lock-in operation of a first interpolation unit.

Operation of the first interpolation unit 41 of FIG. 4 will be described using waveforms of FIGS. 5A and 5B. FIG. 5A shows a state in which the two signals D1' and D2' rise simultaneously. In a state in which the signals D1' and D2' are, the NMOS transistors 56 and 58 become off and both the first and second series circuits are non-conductive. At this time, the output of the NAND circuit 59 goes low so that the PMOS transistor 60 is maintained on, and the node ND1 is charged to high. In this state, when the signals D1' and D2' rise simultaneously, both NMOS transistors 56 and 58 turn on and the output of the NAND circuit 59 goes high so that the PMOS transistor 60 turns off. Thus, current is pulled from the node ND1 through the two series circuits, and voltage level of the node ND1 is gradually reduced with a certain gradient. As shown in FIG. 5A, when time Ta passes, the voltage level reaches a threshold voltage Va of the inverter 61, and the internal clock signal CLK0 rises from low to high after a delay time Tb of the subsequent stage to the node ND1.

Figure 5B:
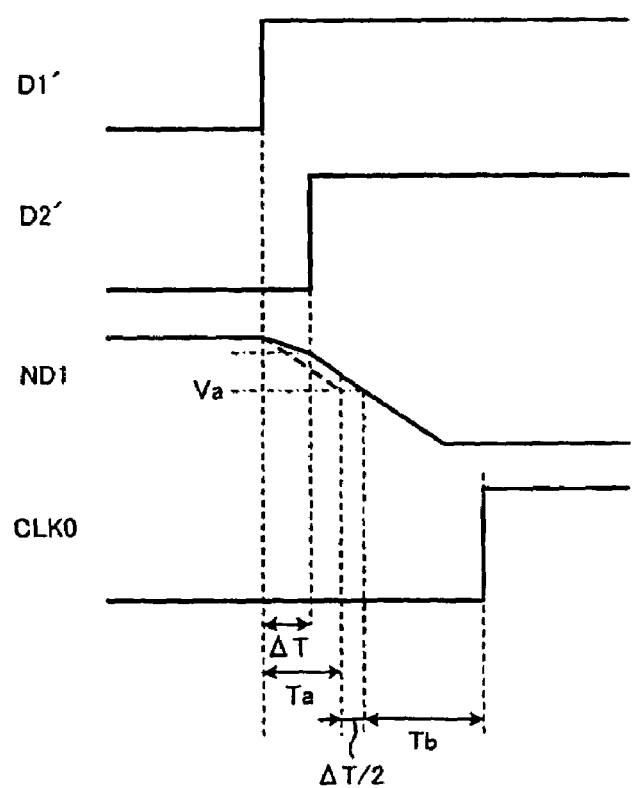

Meanwhile, FIG. 5B shows a state in which, after the signal D1' rises, the signal D2' rises with a delay time ΔT. In a sate in which the signal D1' is high and the signal D2' is low, the NMOS transistor 60 becomes off, the NMOS transistor 56 becomes on and the NMOS transistor 58 becomes off. Therefore, the current pulled from the node ND1 flows only through the first series circuit and does not flow though the second series circuit. As shown in FIG. 5B, the current pulled from the node ND1 is reduced to half compared to FIG. 5A, and correspondingly the gradient of the voltage level during ΔT becomes gentle, so that the time reaching the threshold voltage Va is prolonged to time Ta+ΔT/2. On the other hand, since the delay time Tb is maintained, the internal clock signal CLK0 in FIG. 5B rises with a delay of ΔT/2 compared to FIG. 5A. As a result, the time difference between rising edges of the two signals D1' and D2' is interpolated at the timing when the internal clock signal CLK0 rises, so that an edge timing is obtained by averaging both the signals.

In FIG. 4, regarding falling edges of the two signals D1' and D2', the interpolation is performed based on the same operation described above by the second interpolation unit 42 of FIG. 4. Then, outputs of the first and second interpolation units 41 and 42 are input to the multiplexer 44 respectively, and regarding both rising and falling edges of the two signals D1' and D2', the internal clock signal CLK0 can be obtained by mixing respective output signals of which the time difference is interpolated.

In the state in which the two signals D1 and D2 having the time difference of one cycle as shown in FIG. 2 are generated and fluctuation of the time difference L occurs in one edge thereof due to the influence of jitter, this time difference can be reduced by half to a time difference Δ/2 by the interpolation circuit 13 when using the DLL circuit employing the above-mentioned configuration. Such operation is applicable regardless of whether or not one of the signals D1 and D2 precedes the other, and regardless of whether the edge is a rising or falling edge. By this, if jitter occurs in the reference clock signal CLK when inputting or outputting data using the DQ and DQS signals, an effective window having a sufficient size can be obtained so as to reduce probability of data latching failure.

Figure 6:
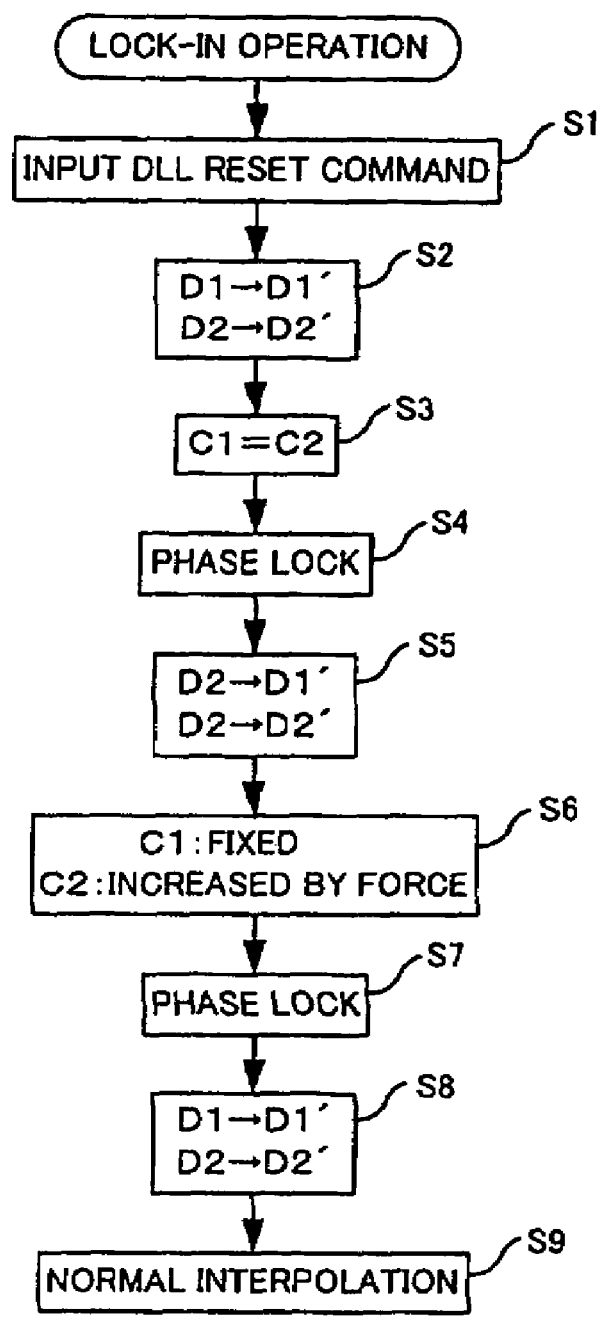
FIG. 6 is an operation flow chart showing steps of a lock-in operation of the DLL circuit of this embodiment.

Next, the lock-in operation of the DLL circuit of this embodiment will be described using FIGS. 6 and 7. Since the phase control is in an unstable state when the DLL circuit is turned on, the phase needs to be locked in by resetting the DLL circuit. In this embodiment, the lock-in operation is performed for the signals D1 and D2 each individually set as a control target. FIG. 6 is an operation flow chart showing steps of the lock-in operation. First, a DLL reset command is input from the outside, so that the lock-in operation is started (Step S1). At this timing, the state of the switch unit 43 is controlled such that the signal D1 is output to the signal D1' and the signal D2 is output to the signal D2' (Step S2).

Figure 7:
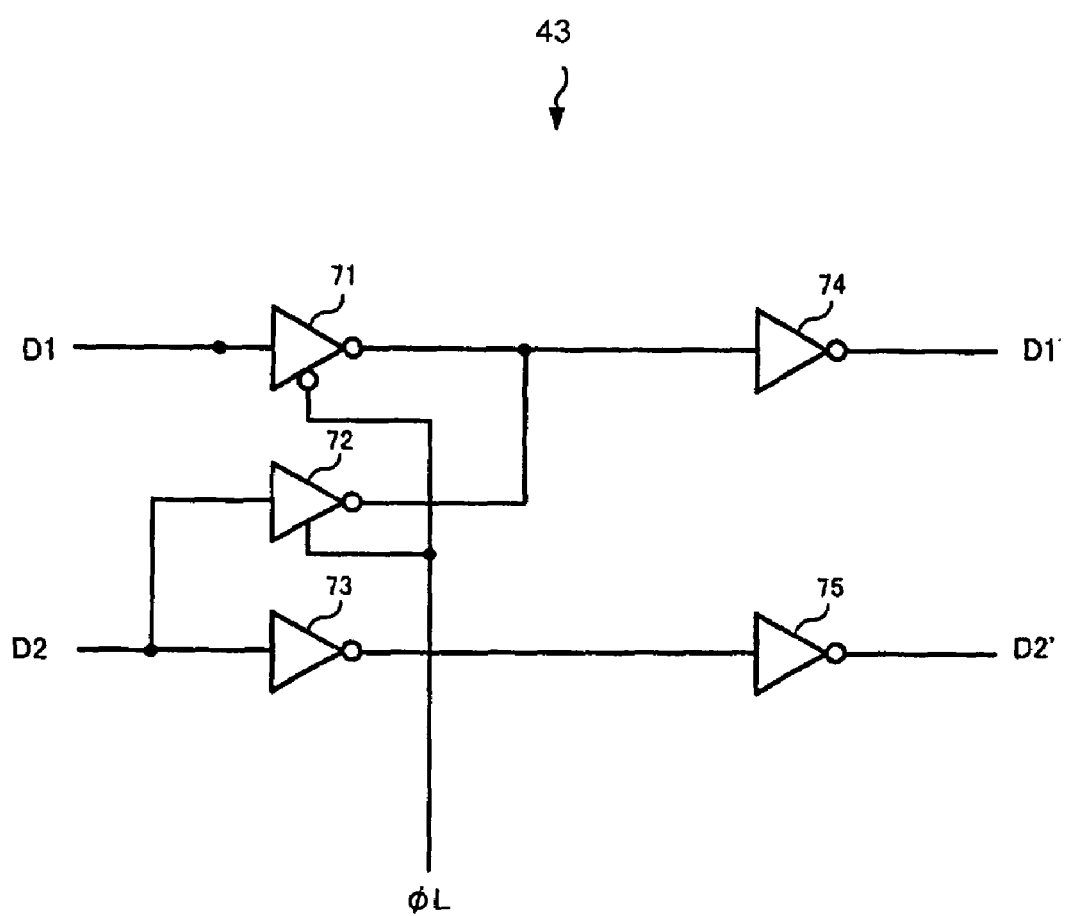
FIG. 7 is a diagram showing a configuration example of a switch unit of the interpolation circuit.

Here, a configuration example of the switch unit 43 is shown in FIG. 7. The switch unit 43 as shown in FIG. 7 includes tri-state inverters 71, 72 and inverters 73, 74, 75. The tri-state inverter 71 to which the signal D1 is input and the tri-state inverter 72 to which the signal D2 is input are controlled by a switch control signal φL supplied to the switch unit 43 so as to have opposite phases to each other. When the switch control signal φL is low, the tri-state inverter 71 becomes on and the tri-state inverter 72 becomes high impedance, and thus the signal D1 is output to the signal D1' and the signal D2 is output to the signal D2'. This corresponds to the control state of step S2. On the contrary, when the switch control signal φL is high, the tri-state inverter 71 becomes high impedance and the tri-state inverter 72 becomes on, and thus only the signal D2 is output as both the signals D1' and D2'.

In FIG. 6, the control signals C1 and C2 which are equal to each other is supplied to the delay circuit 12 (Step S3) by setting the same count value for the first and second delay control circuits 18 and 19, and the signals D1 and D2 has edges of the same timing. In this state, control is performed by the phase comparison circuit 17 such that the external reference clock signal CLK and the feedback clock signal RCLK are in a synchronous state to lock the phase(Step S4).

At this point, the switch control signal φL goes high and the state of the switch unit 43 is switched to a state in which the signal D2 is output to both the signals D1' and D2' (Step S5). In this case, the interpolation operation of the interpolation circuit 13 is performed using the same signal D2. Then, the control signal C1 of the first delay control circuit 18 maintains a state of being fixed and the control signal C2 of the second delay control circuit 19 is controlled to be increased by force. Although the phase goes out of lock in step S6, when the increased amount of the control signal C2 becomes equivalent to one cycle, the phase is locked in which the reference clock signal CLK and the feedback clock signal RCLK are in a synchronous state at a subsequent rising edge (Step S7).

At this point, the switch control signal φL returns to low again and the switch unit 43 is switched to a state in which the signal D1 is output to the signal D1' while the signal D2 is output to the signal D2' (Step S8). Thereafter, the interpolation circuit 13 performs normal interpolation operation using the two signals D1' and D2' (Step S9), the above-mentioned internal clock signal CLK0 is output.

Once the lock-in operation is performed, thereafter as far as operation of the DDR-SDRAM continues, a new lock-in operation is not required. Meanwhile, when the DDR-SDRAM is newly turned on, or when returning from the power down mode, a new lock-in operation is performed. In addition, once the lock-in operation is completed, since phases of the signals D1 and D2 fluctuate with lapse of time, the control signals C1 and C2 need to be updated by adjusting the phases at a predetermined interval.

Here, the phase adjustment in accordance with the comparison result of the comparison circuit 17 may be performed, for example, about once within 10 cycles. In many cases, since the fluctuation of the delay time due to temperature or power supply fluctuation has the same degree of influence on the two signals D1 and D2, the phase can be adjusted by controlling to increase or decrease both the control signals C1 and C2 with the same amount in a direction where the phases are equal. However, when relatively long time passes, it is required to consider relative fluctuation between the signals D1 and D2, so that it is desirable that the control signals C1 and C2 are adjusted by individually increasing or decreasing at a predetermined timing.

For example, such a phase adjustment may be performed at the time of auto refresh which is performed periodically for memory array. Specifically, when an auto refresh command is issued, the switch unit 43 of FIG. 4 is controlled such that the signal D1 is output to both the signals D1' and D2', (shown in phantom in FIG. 4), and the delay time of the signal D1 is adjusted by operation of the phase comparison circuit 17. Then, the switch unit 43 of FIG. 4 is controlled such that the signal D2 is output to both the signals D1' and D2', shown in phantom in FIG. 4) and the delay time of the signal D1 is adjusted by operation of the phase comparison circuit 17. In the DDR-SDRAM, since data is not input/output when performing the auto refresh, jitter occurred in adjusting the phase does not cause a malfunction.

Figure 8:
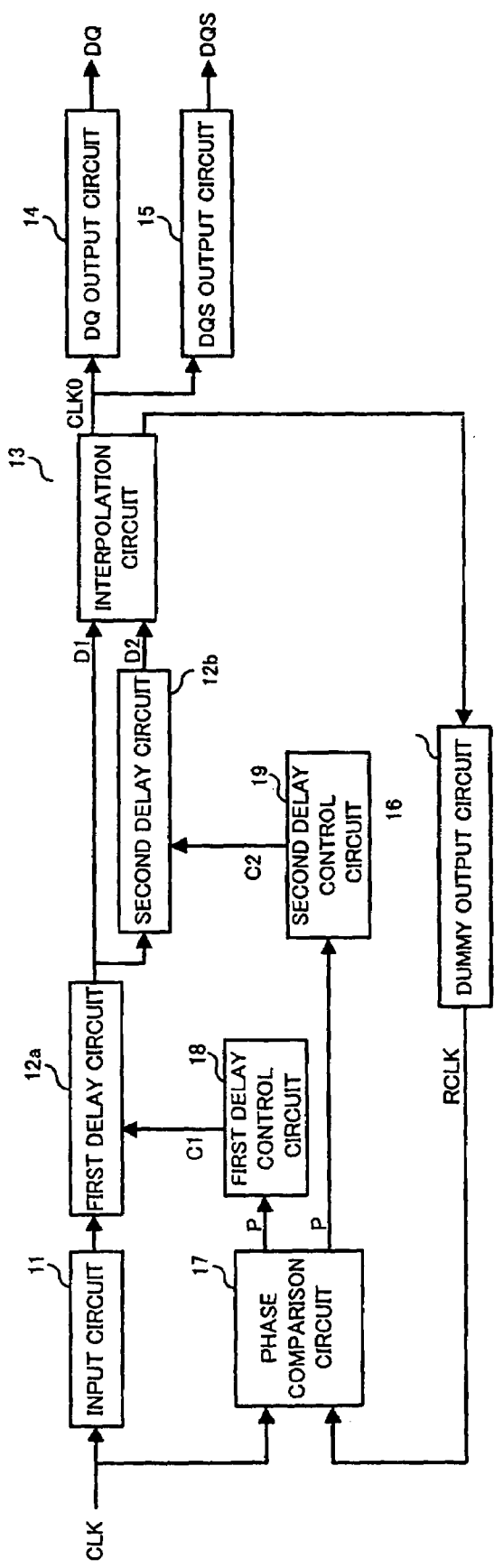
FIG. 8 is a block diagram showing a configuration of a modification of the DLL circuit of this embodiment.

Next, a modification of the DLL circuit of this embodiment will be described. FIG. 8 is a block diagram showing a configuration of the DLL circuit of this modification. In the DLL circuit of FIG. 8, each of the input circuit 11, the interpolation circuit 13, the DQ output circuit 14, the DQS output circuit 15, the dummy output circuit 16, the phase comparison circuit 17, the first delay control circuit 18, and the second delay control circuit 19 has the same configuration as each component of FIG. 1 having the same number, so the description thereof will be omitted. Meanwhile, the DLL circuit as shown in FIG. 8 differs in that a first delay circuit 12a and a second delay circuit 12b are provided corresponding to the delay circuit of FIG. 1.

Figure 9:
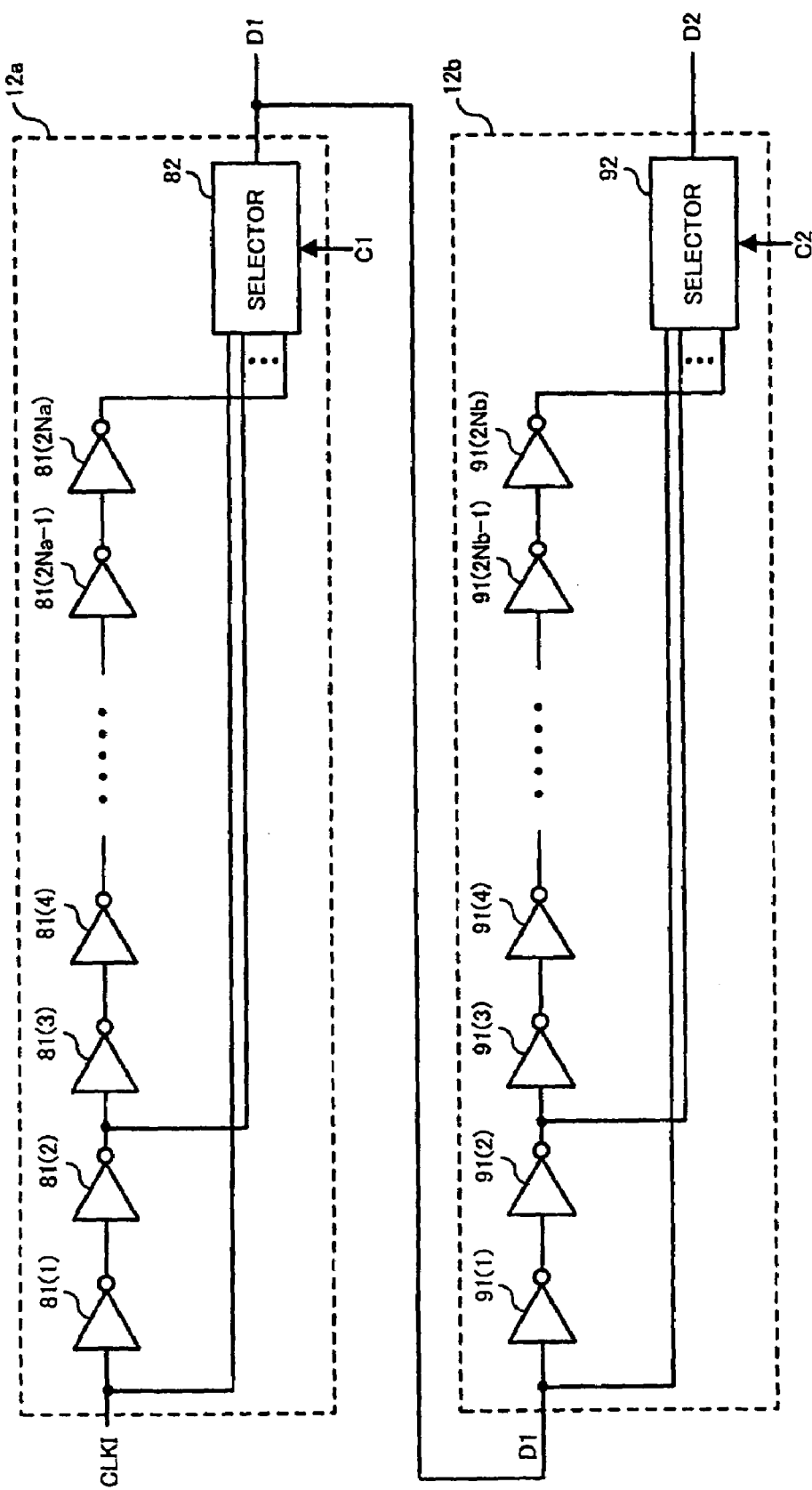
FIG. 9 is a block diagram showing a configuration of a block including first and second delay circuits in the modification of the DLL circuit of this embodiment.
Figure 10:
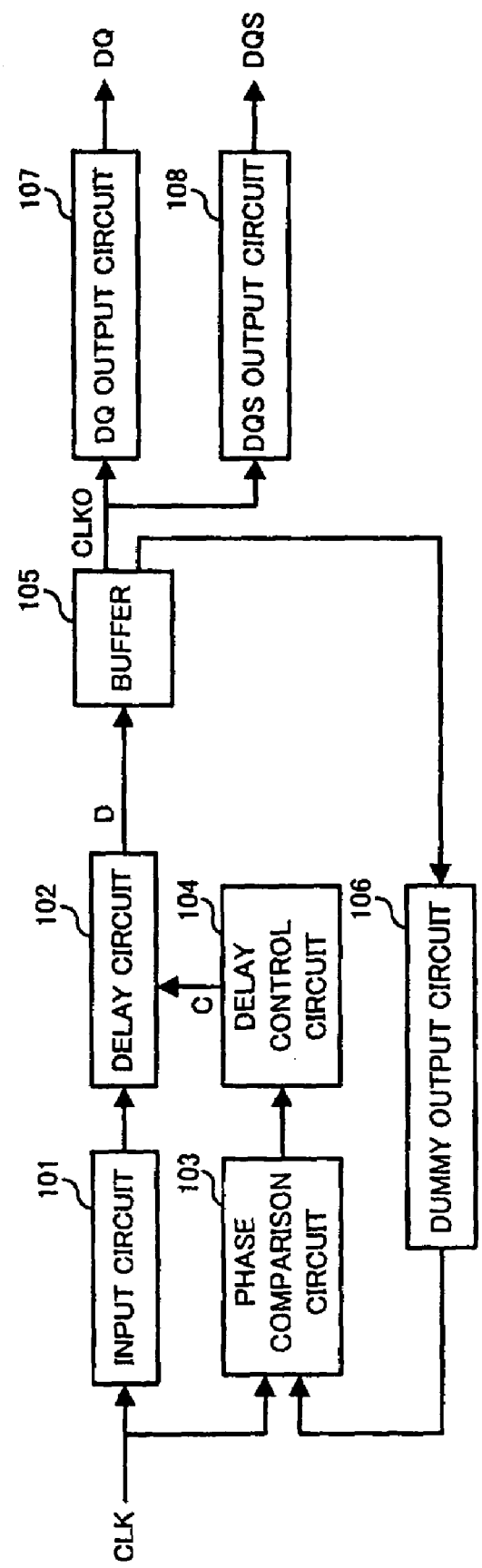
FIG. 10 is a block diagram showing a configuration of a conventional DLL circuit.
Figure 11:
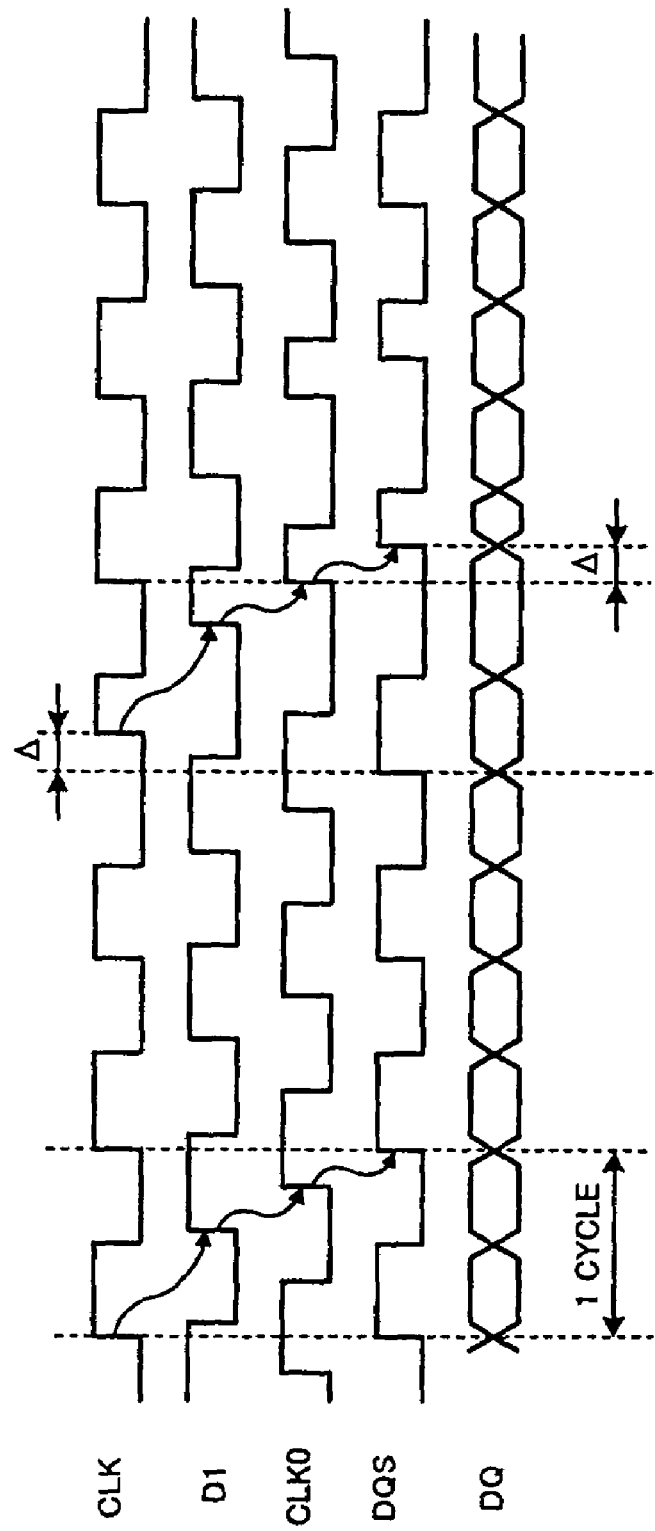
FIG. 11 is a diagram showing operation waveforms of the DLL circuit of FIG. 10.

In FIG. 9, a configuration of a block including the first and second delay circuits 12a and 12b is shown. The first delay circuit 12a includes delay elements of Na stages composed of 2Na inverters 81 (1 to 2Na) connected in multiple stages and a selector 82 connected to Na+1 taps. Further, the second delay circuit 12b includes delay elements of Nb stages composed of 2Nb inverters 91 (1 to 2Nb) connected in multiple stages and a selector 92 connected to Nb−1 taps. Functions of the delay elements connected in multiple stages and the selectors 82 and 92 are the same as the case of FIG. 3. The respective numbers Na and Nb of the stages can be freely adjusted according to the adjustment range of the delay time, and the numbers Na and Nb can be set to different numbers or the same number.

In the first delay circuit 12a, the input clock signal CLK1 is input to a first inverter 81(1), and the signal D1 is output from the selector 82. The output signal D1 is input to the interpolation circuit 13 and is input to a first inverter 91(1) of the second delay circuit 12b. In the second delay circuit 12b, the signal D2 is output from the selector 92 and is input to the interpolation circuit 13. In this manner, the transmission path of the signal D2 includes the transmission path of the signal D1 in this modification. Therefore, the delay time of the signal D1 is determined according to the control signal C1 for the first delay circuit 12a, and the delay time of the signal D2 is determined according to both the control signal C1 for the first delay circuit 12a and the control signal C2 for the second delay circuit 12b.

Operation waveforms of the DLL circuit of this modification are the same as the operation waveforms of FIG. 2. By employing the configuration of this modification, although a larger circuit scale is required in comparison with the configuration of FIG. 1, the response for fluctuation of the delay time due to temperature fluctuation or the like is improved. That is, when a fluctuation amount dt of the delay time in one adjustment of the phase exists, the fluctuation of the delay time is obtained, which is a maximum dt for the signal D1 controlled only by the control signal C1, and which is a maximum 2 dt for the signal D2 controlled by the control signals C1 and C2. Thus, the fluctuation amount for the internal clock signal CLK0 is obtained, which is a maximum 1.5 dt averaged by the interpolation, so that the DLL circuit can follow a rapid fluctuation of the delay time due to temperature fluctuation or the like.

Although the present invention have been specifically described above based on this embodiment, the present invention is not limited to this embodiment described above, and the various changes and modification can be made without departing from the sprit and scope of the present invention. Although the example of the DDR-SDRAM as a semiconductor device to which the present invention is applied is shown, the present invention is widely applicable to the other semiconductor devices. Further, although the example in which the DQ and DQS signals are used for synchronization with the reference clock, the present invention is widely applicable to various signals required for synchronization with the reference clock.

The present invention is not limited to the above described embodiments, and various variations and modifications may be possible without departing from the scope of the present invention.

This application is based on the Japanese Patent application No. 2006-064935 filed on Mar. 9, 2006, entire content of which is expressly incorporated by reference herein.

What is claimed is:

1. A DLL circuit comprising:
   a delay circuit to which a reference clock signal from outside is input and which outputs a first delayed clock signal obtained by delaying said reference clock signal by a delay time selected according to a first control signal and outputs a second delayed clock signal obtained by delaying said reference clock signal by a delay time selected according to a second control signal;
   an interpolation circuit which interpolates a phase difference between said first delayed clock signal as inputted and said second delayed clock signal as inputted so as to output an internal clock signal, comprising a first interpolation unit for interpolating a time difference between rising edges of said first delayed clock signal and said second delayed clock signal, a second interpolation unit for interpolating a time difference between falling edges of said first delayed clock signal and said second delayed clock signal, and a multiplexer for mixing and outputting output signals of said first interpolation unit and said second interpolation unit;

an output circuit which generates a predetermined signal using said internal clock signal as a timing reference and outputs the same to outside;

a dummy output circuit which has the same transmission characteristics as said output circuit, to which said internal clock signal is input, and which outputs a feedback clock signal having the same phase as said predetermined signal;

a phase comparison circuit which compares a phase of said reference clock signal and a phase of said feedback clock signal;

a first delay control circuit which controls said first control signal in a direction where both the phases are equal to each other in said phase comparison; and a second delay control circuit which controls said second control signal in a direction where both the phases are equal to each other in said phase comparison circuit, wherein said second delayed clock signal is controlled such that the delay time thereof is larger than that of said first delayed clock signal by an amount equivalent to one cycle of said reference clock signal.

2. A DLL circuit according to claim 1, wherein said delay circuit comprises:

a plurality of delay elements connected in multiple stages;

a first selector that selectively switches between connections to a plurality of taps of said plurality of delay elements in response to said first control signal; and a second selector that selectively switches between connections to a plurality of taps of said plurality of delay elements in response to said second control signal.

3. A DLL circuit according to claim 1, wherein said delay circuit comprises:

a first delay circuit to which said reference clock signal is input and which outputs said first delayed clock signal obtained by delaying said reference clock signal by a delay time selected according to said first control signal; and a second delay circuit to which said first delayed clock signal is input and which outputs said second delayed clock signal obtained by delaying said first delayed clock signal by a delay time selected according to said second control signal.

4. A DLL circuit according to claim 3, wherein said first delay circuit includes a plurality of delay elements connected in multiple stages, and a selector for selectively switches connections to a plurality of taps of said plurality of delay elements in response to said first control signal, and wherein said second delay circuit includes a plurality of delay elements connected in multiple stages, and a selector for selectively switches connections to a plurality of taps of said plurality of delay elements in response to said second control signal.

5. A DLL circuit according to claim 1, wherein said interpolation circuit controls flow of current pulled from an output node according to said first delayed clock signal and said second delayed clock signal, and operates to average an edge timing of said first delayed clock signal and an edge timing of said second delayed clock signal.

6. A semiconductor device comprising said DLL circuit according to claim 1.

7. A semiconductor device according to claim 6, wherein predetermined signals generated by said output circuit are a signal which includes input/output data of a memory array and a signal which determines a timing to capture the input/output data.

8. A semiconductor device according to claim 7, wherein in an auto refresh of the memory array, the delay time of said first delayed clock signal and the delay time of said second delayed clock signal are adjusted respectively.

9. A semiconductor device according to claim 6, further comprising lock-in controller for controlling a lock-in operation, when resetting the DLL circuit, from a state in which the delay time of said first delayed clock signal and the delay time of said second delayed clock signal are equal to each other, and after increasing the delay time of said second delayed clock signal by an amount equivalent to one cycle of said reference clock signal by force, shifting to normal phase control.

10. A DLL circuit comprising:

a delay circuit to which a reference clock signal from outside is input and which outputs a first delayed clock signal obtained by delaying said reference clock signal by a delay time selected according to a first control signal and outputs a second delayed clock signal obtained by delaying said reference clock signal by a delay time selected according to a second control signal;

an interpolation circuit which interpolates a phase difference between said first delayed clock signal as inputted and said second delayed clock signal as inputted so as to output an internal clock signal;

an output circuit which generates a predetermined signal using said internal clock signal as a timing reference and outputs the same to outside;

a dummy output circuit which has the same transmission characteristics as said output circuit, to which said internal clock signal is input, and which outputs a feedback clock signal having the same phase as said predetermined signal;

a phase comparison circuit which compares a phase of said reference clock signal and a phase of said feedback clock signal;

a first delay control circuit which controls said first control signal in a direction where both the phases are equal to each other in said phase comparison;

a second delay control circuit which controls said second control signal in a direction where both the phases are equal to each other in said phase comparison circuit, wherein said second delayed clock signal is controlled such that the delay time thereof is larger than that of said first delayed clock signal by an amount equivalent to one cycle of said reference clock signal;

said interpolation circuit controls flow of current pulled from an output node according to said first delayed clock signal and said second delayed clock signal, and operates to average an edge timing of said first delayed clock signal and an edge timing of said second delayed clock signal; and, a first interpolation unit for interpolating a time difference between rising edges of said first delayed clock signal and said second delayed clock signal;

a second interpolation unit for interpolating a time difference between falling edges of said first delayed clock signal and said second delayed clock signal; and a multiplexer for mixing and outputting output signals of said first interpolation unit and said second interpolation unit.

11. A DLL circuit comprising:

a delay circuit to which a reference clock signal from outside is input and which outputs a first delayed clock signal obtained by delaying said reference clock signal by a delay time selected according to a first control signal and outputs a second delayed clock signal obtained by delaying said reference clock signal by a delay time selected according to a second control signal;

an interpolation circuit which interpolates a phase difference between said first delayed clock signal and said second delayed clock signal so as to output an internal clock signal;

an output circuit which generates a predetermined signal using said internal clock signal as a timing reference and outputs the same to outside;

a dummy output circuit which has the same transmission characteristics as said output circuit, to which said internal clock signal is input, and which outputs a feedback clock signal having the same phase as said predetermined signal;

a phase comparison circuit which compares a phase of said reference clock signal and a phase of said feedback clock signal;

a first delay control circuit which controls said first control signal in a direction where both the phases are equal to each other in said phase comparison circuit; and a second delay control circuit which controls said second control signal in a direction where both the phases are equal to each other in said phase comparison circuit, wherein said second delayed clock signal is controlled such that the delay time thereof is larger than that of said first delayed clock signal by an amount equivalent to one cycle of said reference clock signal, wherein said interpolation circuit controls flow of current pulled from an output node according to said first delayed clock signal and said second delayed clock signal, and operates to average an edge timing of said first delayed clock signal and an edge timing of said second delayed clock signal, and a first interpolation unit for interpolating a time difference between rising edges of said first delayed clock signal and said second delayed signal;

a second interpolation unit for interpolating a time difference between falling edges of said first delayed clock signal and said second delayed signal; and a multiplexer for mixing and outputting output signals of said first interpolation unit and said second interpolation unit.

12. A DLL circuit according to claim 11, wherein said delay circuit comprises:

a plurality of delay elements connected in multiple stages;

a first selector that selectively switches between connections to a plurality of taps of said plurality of delay elements in response to said first control signal; and a second selector that selectively switches between connections to a plurality of taps of said plurality of delay elements in response to said second control signal.

13. A DLL circuit according to claim 11, wherein said delay circuit comprises:

a first delay circuit to which said reference clock signal is input and which outputs said first delayed clock signal obtained by delaying said reference clock signal by a delay time selected according to said first control signal; and a second delay circuit to which said first delayed clock signal is input and which outputs said second delayed clock signal obtained by delaying said first delayed clock signal by a delay time selected according to said second control signal.

14. A DLL circuit according to claim 13, wherein said first delay circuit includes a plurality of delay elements connected in multiple stages, and a selector for selectively switches connections to a plurality of taps of said plurality of delay elements in response to said first control signal, and wherein said second delay circuit includes a plurality of delay elements connected in multiple stages, and a selector for selectively switches connections to a plurality of taps of said plurality of delay elements in response to said second control signal.

15. A DLL circuit according to claim 11, wherein predetermined signals generated by said output circuit are a signal which includes input/output data of a memory array and a signal which determines a timing to capture the input/output data.

16. A DLL circuit according to claim 15, wherein in an auto refresh of the memory array, the delay time of said first delayed clock signal and the delay time of said second delayed clock signal are adjusted respectively.

17. A DLL circuit according to claim 11, further comprising lock-in controller for controlling a lock-in operation, when resetting the DLL circuit, from a state in which the delay time of said first delayed clock signal and the delay time of said second delayed clock signal are equal to each other, and after increasing the delay time of said second delayed clock signal by an amount equivalent to one cycle of said reference clock signal by force, shifting to normal phase control.

18. A DLL circuit comprising:

a delay circuit including a first input terminal supplied with an external reference clock signal, a first output terminal outputting a first delayed clock signal, and a second output terminal outputting a second delayed clock signal;

a combining circuit including a second input terminal coupled with said first output terminal, a third input terminal coupled with said second output terminal, and a third output terminal outputting an internal clock signal;

a first interpolation unit for interpolating a time difference between rising edges of said first delayed clock signal and said second delayed clock signal;

a second interpolation unit for interpolating a time difference between falling edges of said first delayed clock signal and said second delayed clock signal; and a multiplexer for mixing and outputting output signals of said first interpolation unit and said second interpolation unit; and a utilization circuit utilizing said internal clock signal to perform a circuit operation, wherein said second delayed clock signal is controlled such that the delay time thereof is larger than that of said first delayed clock signal by an amount substantially equal to one cycle of said external reference clock signal.

19. The DLL circuit according to claim 18, wherein said combining circuit interpolates a phase difference between said first delayed clock signal and said second delayed clock signal so as to output said internal clock signal having a middle phase therebetween.

20. The DLL circuit according to claim 19, wherein said first delayed clock signal is obtained by delaying said external reference clock in response to a first control signal and said second delayed clock signal is obtained by delaying said external reference clock in response to a second control signal, and said DLL circuit further comprises;

a transmission circuit including a fourth input terminal supplied with said internal clock signal and a fourth output terminal outputting a feedback clock signal;

a phase comparison and delay control circuit including a fifth input terminal coupled to said fourth output terminal, a sixth input terminal supplied with said external reference clock signal, fifth output terminal outputting said first control signal circuit and sixth output terminal outputting said second control signal circuit, wherein said phase comparison and delay control circuit compares a phase of said external reference clock signal and a phase of said feedback clock signal said transmission circuit has the same transmission characteristics as said utilization circuit, and the loop including said delay circuit, said combining circuit, said transmission circuit and said phase comparison and delay control circuit acts so as to adjust the phase of said feedback clock signal and the phase of the output signal of said utilization circuit.

* * * * *